(12) United States Patent
Im et al.

(10) Patent No.: US 7,977,681 B2
(45) Date of Patent: Jul. 12, 2011

(54) PHOTO SENSOR AND LIGHT EMITTING DISPLAY HAVING THE SAME

(75) Inventors: Ki-Ju Im, Suwon-si (KR); Byong-Deog Choi, Suwon-si (KR); Won-Sik Kim, Suwon-si (KR); Hye-Hyang Park, Suwon-si (KR); Hui-Won Yang, Suwon-si (KR); Yun-Gyu Lee, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 208 days.

(21) Appl. No.: 12/222,003

(22) Filed: Jul. 31, 2008

(65) Prior Publication Data

US 2009/0032823 A1 Feb. 5, 2009

(30) Foreign Application Priority Data

Aug. 1, 2007 (KR) ........................ 10-2007-0077473

(51) Int. Cl.
H01L 29/04 (2006.01)
H01L 31/036 (2006.01)
H01L 27/15 (2006.01)
H01L 31/12 (2006.01)
H01L 33/00 (2006.01)
H01L 31/0232 (2006.01)
G01J 1/42 (2006.01)

(52) U.S. Cl. ...... 257/72; 257/80; 257/432; 257/E31.001; 257/E31.095; 257/E31.097; 257/E33.001; 250/208.5

(58) Field of Classification Search ............... 250/208.5; 257/E31.095, E31.097, 72, 80, 432, E31.001, 257/E33.001
See application file for complete search history.

(56) References Cited

U.S. PATENT DOCUMENTS

| | | | |
|---|---|---|---|
| 4,574,190 A * | 3/1986 | Nishimura | 235/449 |
| 2005/0174617 A1 | 8/2005 | Hosier et al. | |
| 2005/0249377 A1 | 11/2005 | Fouquet et al. | |
| 2006/0097297 A1 | 5/2006 | Lee | |
| 2007/0237888 A1 * | 10/2007 | Liu et al. | 427/58 |
| 2009/0162971 A1 * | 6/2009 | Sze et al. | 438/97 |
| 2010/0219985 A1 * | 9/2010 | Schofield et al. | 340/932.2 |
| 2010/0253944 A1 * | 10/2010 | McCawley et al. | 356/336 |

FOREIGN PATENT DOCUMENTS

| | | | |
|---|---|---|---|
| DE | 116095 A * | 8/1974 | |
| JP | 2002023658 A * | 1/2002 | |
| JP | 2005-223903 | 8/2005 | |
| JP | 2005-321388 | 11/2005 | |
| KR | 10-2000-0039651 A | 7/2000 | |
| KR | 10-2006-0010911 A | 2/2006 | |
| KR | 10-2006-0041549 A | 5/2006 | |
| KR | 10-2006-0053455 A | 5/2006 | |

* cited by examiner

Primary Examiner — David S Blum
(74) Attorney, Agent, or Firm — Lee & Morse, P.C.

(57) ABSTRACT

A photo sensor includes a light incidence unit including a plurality of light incidence layers, the light incidence unit having a varying light transmittance with respect to external light, and a photo sensing unit including a plurality of photo sensing elements, the photo sensing unit being configured to output electrical signals in accordance with an amount of light transmitted through the light incidence unit to determine intensity of the external light, each of the photo sensing elements being configured to output electrical signals in accordance with light transmitted through a respective light incidence layer.

21 Claims, 5 Drawing Sheets

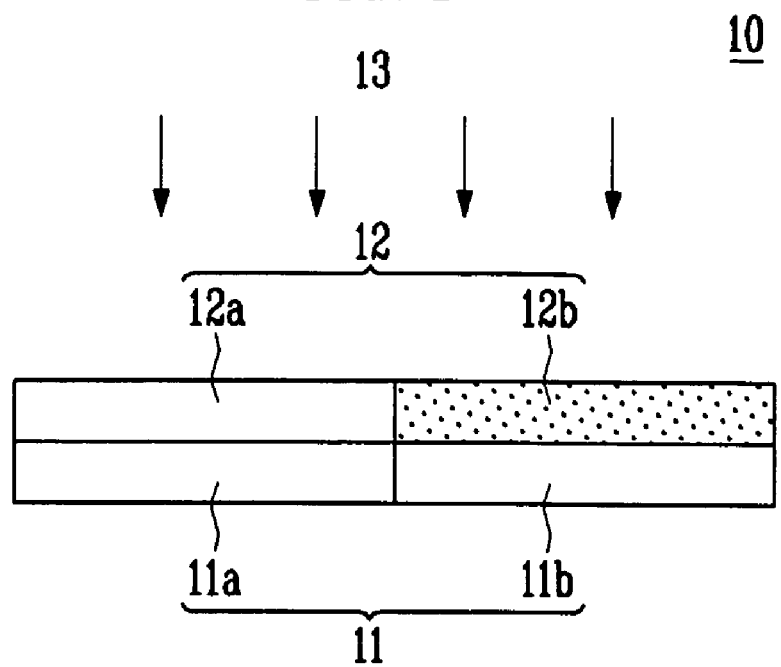
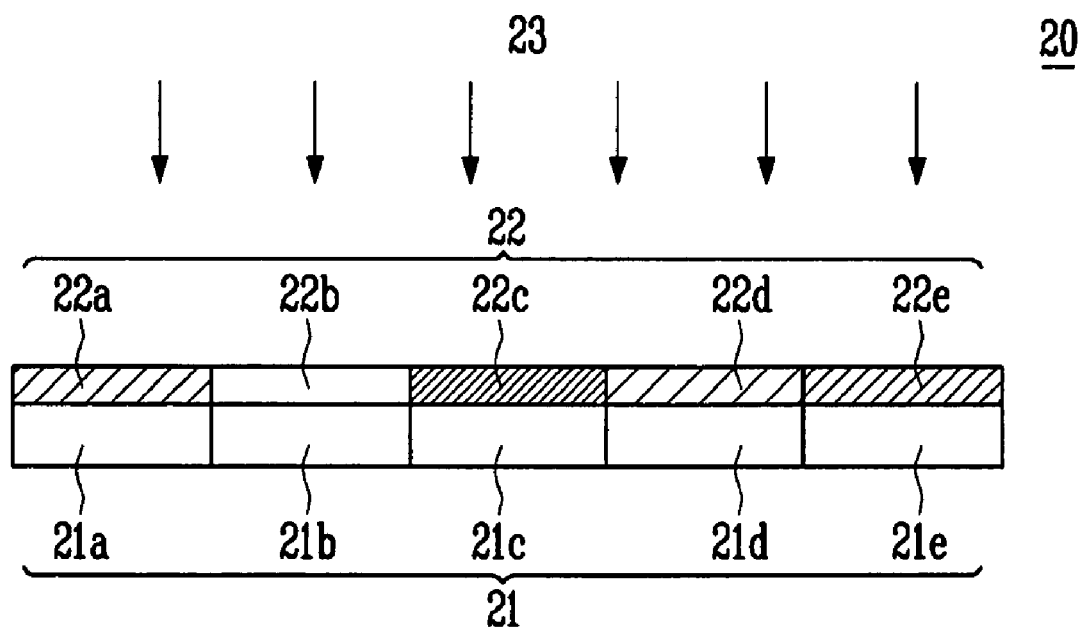

ns in accordance with an amount of light transmitted through the light incidence unit to determine intensity of the external light, each of the photo sensing elements being configured to output electrical signals in accordance with light transmitted through a respective light incidence layer.

PHOTO SENSOR AND LIGHT EMITTING DISPLAY HAVING THE SAME

BACKGROUND OF THE INVENTION

1. Field of the Invention

Embodiments of the present invention relate to a photo sensor. More particularly, embodiments of the present invention relate to a photo sensor with improved light sensitivity and a light emitting display including the same.

2. Description of the Related Art

An organic light emitting display is a self-emission display exhibiting improved characteristics, e.g., viewing angles, contrast, response speed, power consumption, and so forth, as compared to conventional display, e.g., a liquid crystal display (LCD).

The conventional organic light emitting display may include organic light emitting diodes (OLEDs), i.e., organic light emitting layers between anode and cathode electrodes. The organic light emitting displays may be divided into passive matrix types, i.e., the OLEDs may be coupled to each other between scan and signal lines in a matrix to form pixels, and active matrix types, i.e., the OLEDs may be controlled independently by thin film transistors (TFTs) that serve as switches.

The conventional organic light emitting display may operate by applying voltage to the anode and cathode electrodes of the OLEDs, so the organic light emitting layers may emit light in response to the voltage. The conventional OLEDs, however, may have a predetermined brightness range regardless of external light, so brightness output from the conventional organic light emitting display may be unaffected by changes in external luminance. For example, when external luminance is high, brightness output from the conventional organic light emitting display may be too low, and when external luminance is low, brightness of from the conventional organic light emitting display may be too high. As such, contrast in the conventional organic light emitting display may be reduced, so image visibility may be deteriorated. In addition, the predetermined brightness range of the OLEDs may increase power consumption of the conventional light emitting display.

SUMMARY OF THE INVENTION

Embodiments of the present invention are therefore directed to a photo sensor and an organic light emitting display including the same, which substantially overcome one or more of the disadvantages and shortcomings of the related art.

It is therefore a feature of an embodiment of the present invention to provide a photo sensor with light incidence units capable of improving light sensitivity to external light.

It is another a feature of an embodiment of the present invention to provide a photo sensor for controlling brightness output of an organic light emitting display in accordance with external light.

It is yet another feature of an embodiment of the present invention to provide an organic light emitting display including a photo sensor with one or more of the above features.

At least one of the above and other features and advantages of the present invention may be realized by providing a photo sensor, including a light incidence unit with a plurality of light incidence layers, the light incidence unit having a varying light transmittance with respect to external light, and a photo sensing unit with a plurality of photo sensing elements, the photo sensing unit being configured to output electrical signals in accordance with an amount of light transmitted through the light incidence unit to determine intensity of the external light, each of the photo sensing elements being configured to output electrical signals in accordance with light transmitted through a respective light incidence layer.

The light incidence unit may be on the photo sensing unit. The light incidence layers may be coplanar, each light incidence layer overlapping a respective photo sensing element. A surface area of a surface of each light incidence layer facing the photo sensing element may substantially equal a surface area of a surface of the respective photo sensing element facing the light incidence layer. A surface area of a surface of each light incidence layer facing the photo sensing element may be larger than a surface area of a surface of the respective photo sensing element facing the light incidence layer. The photo sensing elements may be spaced apart from each other. The light incidence unit may be in a light path of the external light incident on the photo sensing unit. Each of the light incidence layers may exhibit a uniform light transmittance, light transmittance of each light incidence layer being different than light transmittance of other light incidence layers in the light incidence unit. The light incidence layers may include one or more of glass, celluloid, and/or plastic. The light incidence unit may include a plurality of partitions, each partition being between two adjacent light incidence layers. The photo sensing elements may include photo diodes, photo resistors, and/or photo transistors. The photo sensing elements may have a substantially same threshold current. The external light may exhibit a substantially constant luminance.

At least one of the above and other features and advantages of the present invention may be also realized by providing a light emitting display, including a light source, and a photo sensor electrically connected to the light source, the photo sensor including, a light incidence unit with a plurality of light incidence layers, the light incidence unit having a varying light transmittance with respect to external light, and a photo sensing unit with a plurality of photo sensing elements, the photo sensing unit being configured to output electrical signals in accordance with an amount of light transmitted through the light incidence unit to determine intensity of the external light, each of the photo sensing elements being configured to output electrical signals in accordance with light transmitted through a respective light incidence layer.

The light emitting display may further include a thin film transistor on a substrate, the thin film transistor including a semiconductor layer, a gate insulation layer, a gate electrode, an interlayer insulating layer, and source and drain electrodes. The light source may be an organic light emitting diode, the organic light emitting diode being electrically coupled with the thin film transistor. The electric signals output from the photo sensor may be configured to adjust brightness of the organic light emitting diode with respect to the external light. The photo sensor may be in a non-pixel region of the substrate. The light emitting display may further include at least one insulating layer between the light incidence unit and the photo sensing unit. The light incidence unit may be an uppermost layer of the light emitting display.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 1 illustrates a cross-sectional view of a photo sensor according to an embodiment of the present invention;

FIG. 2 illustrates a cross-sectional view of a photo sensor according to another embodiment of the present invention;

DETAILED DESCRIPTION OF THE INVENTION

Figure 3:
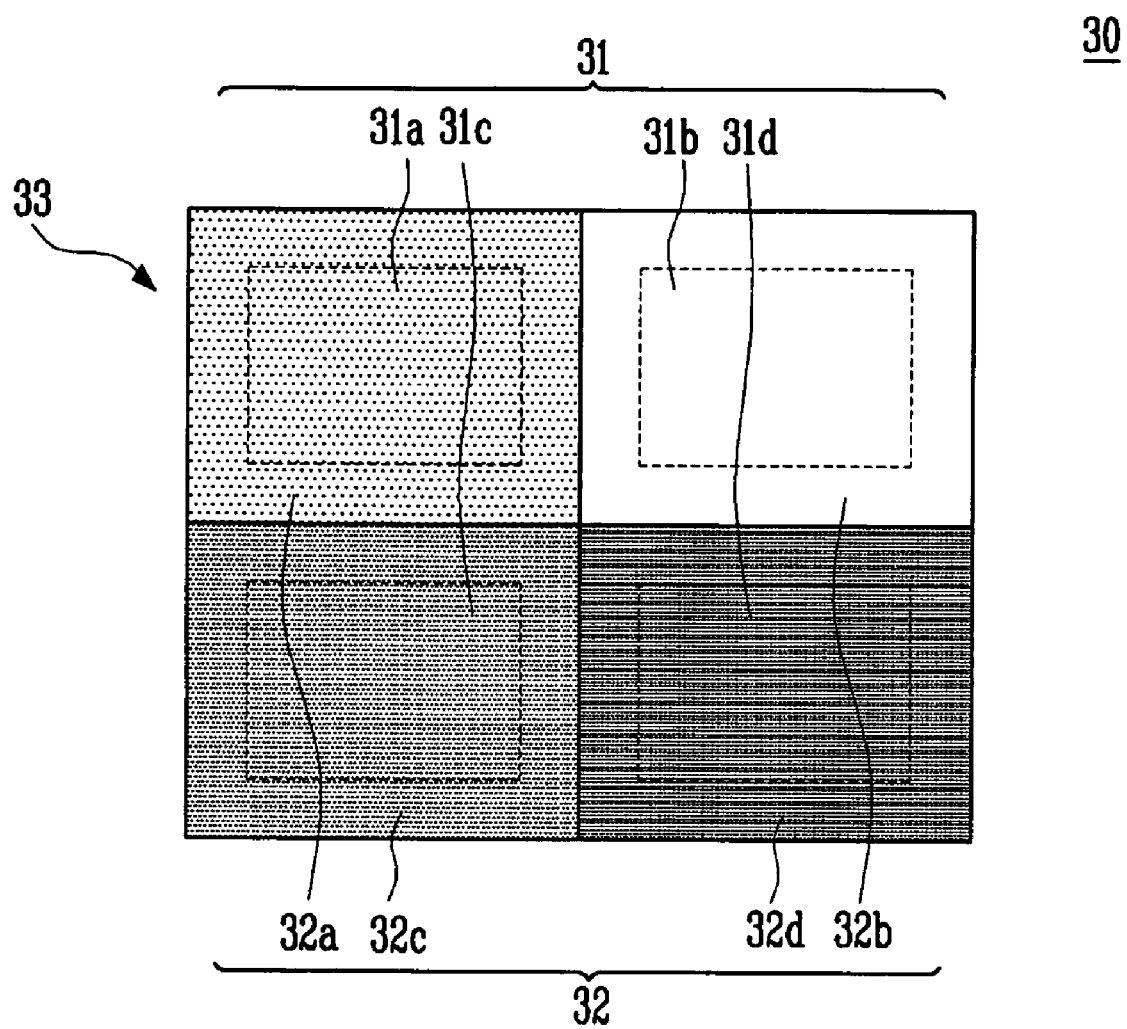
FIG. 3 illustrates a plan view of a photo sensor according to another embodiment of the present invention.

Korean Patent Application No. 10-2007-0077473, filed on Aug. 1, 2007, in the Korean Intellectual Property Office, and entitled: "Photo Sensor and Light Emitting Display Having the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers, elements, and regions may be exaggerated for clarity of illustration. It will also be understood that when a layer or element is referred to as being "on" another layer, element, or substrate, it can be directly on the other layer, element, or substrate, or intervening layers and/or elements may also be present. Further, it will be understood that the term "on" can indicate solely a vertical arrangement of one element with respect to another element, and may not indicate a vertical orientation, e.g., a horizontal orientation. In addition, it will be understood that when a layer or element is referred to as being "coupled" to another layer or element, they can be coupled directly, or one or more intervening layers and/or elements may also be present. Further, it will also be understood that when a layer or element is referred to as being "between" two layers or elements, it can be the only layer or element between the two layers or elements, or one or more intervening layers and/or elements may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

FIG. 1 illustrates a sectional view of a photo sensor according to a first embodiment of the present invention. Referring to FIG. 1, a photo sensor 10 may include a light incidence unit 12 on a photo sensing unit 11. The light incidence unit 12 may include a plurality of light incidence layers with varying transmittance degrees with respect to external light 13, i.e., ambient light external to the photo sensor 10. The photo sensing unit 11 may include a plurality of photo sensing elements for outputting electrical signals in accordance with an amount of light transmitted through the plurality of light incidence layers of the light incidence unit 12. In particular, the external light 13 incident on the light incidence unit 12 may be transmitted through the plurality of the light incidence layers toward the photo sensing unit 11, so the photo sensing elements of the photo sensing unit 11 may convert intensity of detected external light into electrical signals. The photo sensing elements of the photo sensing unit 11 may output the electrical signals to adjust a light source according to the detected intensity of the external light. The light incidence layers and the photo sensing elements may correspond to each other.

The photo sensing unit 11 of the photo sensor 10 may be any unit capable of sensing the intensity of the external light 13 and generating corresponding electrical signals. For example, the photo sensing unit 11 may include one or more of photo resistors, i.e., elements having varying resistance values in accordance with incident light, photo transistors, i.e., elements amplifying current values between bases and collectors in accordance with incident light, and photo diodes. For example, the plurality of photo sensing elements of the photo sensing unit 11 may be a plurality of photo diodes.

The photo sensing unit 11 may include a plurality of photo diodes connected in parallel to improve current value. Accordingly, n photo diodes of W×L may be coupled to each other to have n parallel structures of W×L/n. For example, as illustrated in FIG. 1, the photo sensing unit 11 may include first and second photo diodes 11a and 11b, i.e., n=2, connected in parallel to have 2 parallel structures of W×L/2. The photo sensing unit 11 may have a horizontal structure, so the plurality of photo diodes, e.g., first and second photo diodes 11a and 11b, may be coplanar along a plane supporting the photo sensor 10. The first and second photo diodes 11a and 11b may have a substantially same threshold current.

The light incidence unit 12 may be on the photo sensing unit 11, so the light incidence unit 12 may be between the photo sensing unit 11 and the external light 13. In other words, the light incidence unit 12 may be in a light path of the external light 13 incident on the photo sensing unit 11. The light incidence unit 12 may include a plurality of light incidence layers, so each light incidence layer may be on a corresponding photo sensing element of the photo sensing unit 11. For example, as illustrated in FIG. 1, the light incidence unit 12 may include first and second light incidence layers 12a and 12b. As further illustrated in FIG. 1, the first and second light incidence layers 12a and 12b may be on the first and second photo diodes 11a and 11b, respectively. Each of the first and second light incidence layers 12a and 12b may completely overlap its corresponding photo diode. In other words, a surface area of a surface of each light incidence layer facing the photo sensing unit 11 may substantially equal a surface area of a surface of the respective photo sensing element facing the light incidence unit 12. For example, the first light incidence layer 12a and the first photo diode 11a may have substantially same respective widths and lengths. The light incidence layers of the light incidence unit 12 may be coplanar, i.e., the light incidence layers may be on a substantially same flat surface. For example, each of the first and second light incidence layers 12a and 12b may be directly on an upper surface of the photo sensing unit 11, as illustrated in FIG. 1. Alternatively, each of the first and second light incidence layers 12a and 12b may be directly on a separating layer (not shown), so the separating layer may be between the light incidence unit 12 and the photo sensing unit 11. The separating layer may be transparent.

The light incidence unit 12 may exhibit varying light transmittance with respect to the external light 13. In other words, light transmittance through the light incidence unit 12 may not be uniform, so predetermined portions of the light incidence unit 12 may transmit more light than other portions of the light incidence unit 12. More specifically, the plurality of light incidence layers of the light incidence unit 12 may have varying degrees of light transmittance, so each of the light incidence layers may exhibit different light transmittance. For example, each of the first and second light incidence layers 12a and 12b may transmit a different amount of light toward the first and second diodes 11a and 11b, respectively. Accordingly, each of the first and second photo diodes 11a and 11b may detect a different amount of light. The light incidence unit 12 may include a filter, e.g., a material capable of filtering light, so predetermined portions thereof may have lower light transmittance than other portions of the light incidence unit 12. The light incidence layers 12a and 12b may be formed of glass, plastic, and/or a filter material in order to provide the varying light transmittance with respect to the external light 13.

For example, the first light incidence layer 12a may be formed to exhibit about 100% light transmittance and the second light incidence layer 12b may exhibit about 50% light transmittance. In other words, when the external light 13 is incident on the first light incidence layer 12a, substantially all the external light 13 may be transmitted through the first incidence layer 12a toward the first photo diode 11a. When the external light 13 is incident on the second light incidence layer 12b, about 50% of the external light 13 incident on the second light incidence layer 12b may be transmitted therethrough toward the second photo diode 11b. Accordingly, sensitivity of the photo sensing unit 11 with respect to luminance of the external light 13 may be increased, thereby increasing measurement accuracy of the external light luminance.

More specifically, operating conditions of the photo sensor 10 may be defined according to Table 1 below.

TABLE 1

|  | Luminance (lx) | Operating Condition |
| --- | --- | --- |
| Range 1 | 0~80 | Darkness and very dark indoors |
| Range 2 | 300~1,000 | Bright indoors |

If the external light 13 is within Range 1, i.e., dark environment, all the amount of light may be transmitted through the first light incidence layer 12a, i.e., a layer having about 100% transmittance, toward the first diode 11a. If the amount of light incident on the first diode 11a is sufficient to generate a current flow, i.e., no less than a threshold current, the first photo diode 11a may be turned on. Since the external light 13 within Range 1 has low luminance and the second light incidence layer 12b may transmit only 50% of the external light 13, i.e., a layer having about 50% transmittance, the amount of transmitted light incident on the second photo diode 11b may be insufficient to generate a current flow above a threshold current. Accordingly, the second photo diode 11b may not be turned on. Therefore, within operating conditions of Range 1, the first photo diode 11a may be turned on, while the second photo diode 11b may be turned off.

If the external light 13 is within Range 2, i.e., bright environment, the amount of light transmitted through both the first and second light incidence layers 12a and 12b may be sufficient to generate a current flow in both the first and second photo diodes 11a and 11b, so both the first and second photo diodes 11a and 11b may be turned on. As such, use of multiple light incidence layers with varying transmittance values may improve light sensitivity of the photo diodes with respect to external luminance, so intensity of the external light may be measured with improved precision and accuracy.

Therefore, a photo sensor according to embodiments of the present invention may be advantageous in providing enhanced sensitivity to light. In particular, since a dynamic range on/off current ratio of a photo diode may be low, e.g., a high amount of light may cause light saturation, use of the light incidence unit 12 in the photo sensor 10 may substantially increase sensitivity to light of the photo sensing unit 11. In other words, providing the light incidence unit 12 with varying light transmittance in a light path of the external light 13 incident on the photo sensing unit 11 may turn on/off the photo sensing elements 11 with respect to threshold current therethrough, so the external light 13 may be measured with enhanced accuracy and precision. In addition, the turning on/off of the photo sensing elements 11 may be controlled by adjusting transmittance values of the light incidence layers 12a and 12b.

According to another embodiment illustrated in FIG. 2, a photo sensor 20 may be substantially similar to the photo sensor 10 described previously with reference to FIG. 1, with the exception of including a larger number of light incidence layers and photo sensing elements. For example, the photo sensor 20 may include a light incidence unit 22 having a first light incidence layer 22a, a second light incidence layer 22b, a third light incidence layer 22c, a fourth light incidence layer 22d, and a fifth light incidence layer 22e, and a photo sensing unit 21 having a first photo sensing element 21a, a second photo sensing element 21b, a third photo sensing element 21c, a fourth photo sensing element 21d, and a fifth photo sensing element 21e. Structure of each of the light incidence layers and photo sensing elements and structural relationships therebetween may be substantially similar to those of the light incidence layers and photo sensing elements of the photo sensor 10, and therefore, will not be repeated.

The plurality of light incidence layers of the light incidence unit 22 may exhibit varying light transmittance values with respect to an external light 23, e.g., be discontinuous with respect to each other to facilitate formation of layers with different transmittances values. An increase in the number of light incidence layers of the light incidence unit 22 may increase measurement accuracy and precision of the luminance of the external light 23. In addition, the light incidence unit 22 may include a thin film or celluloid, so light incidence unit 22 may be thinner than the light incidence unit 12 along the vertical direction. As such, overall thickness of the photo sensor 20, as compared to thickness of the photo sensor 10 of FIG. 1, may be reduced.

According to another embodiment illustrated in FIG. 3, a photo sensor 30 may be substantially similar to the photo sensor 10 described previously with reference to FIG. 1, with the exception of having different sizes of the photo sensing elements. In other words, the photo sensor 30 may include a light incidence unit 32 having a first light incidence layer 32a, a second light incidence layer 32b, a third light incidence layer 32c, and a fourth light incidence layer 32d, and a photo sensing unit 31 having a first photo sensing element 31a, a second photo sensing element 31b, a third photo sensing element 31c, and a fourth photo sensing element 31d. A surface area of a surface of each light incidence layer facing the photo sensing unit 31 may be larger than a surface area of a surface of the respective photo sensing element facing the light incidence unit 32. For example, as illustrated in FIG. 3, the widths and lengths of each of the photo sensing elements 31a, 31b, 31c, and 31d may be smaller than respective widths and lengths of each of the light incidence layers 32a, 32b, 32c, and 32d. Accordingly, the photo sensing elements 31a, 31b, 31c, and 31d may be spaced apart from each other by a predetermined distance, as further illustrated in FIG. 3.

Figure 4:
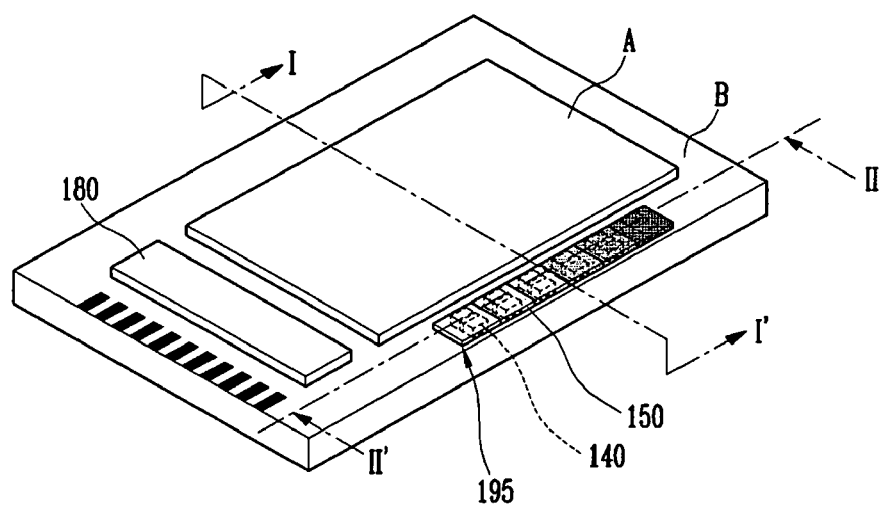
FIG. 4 illustrates a perspective view of an organic light emitting display according to an embodiment of the present invention.
Figure 5:
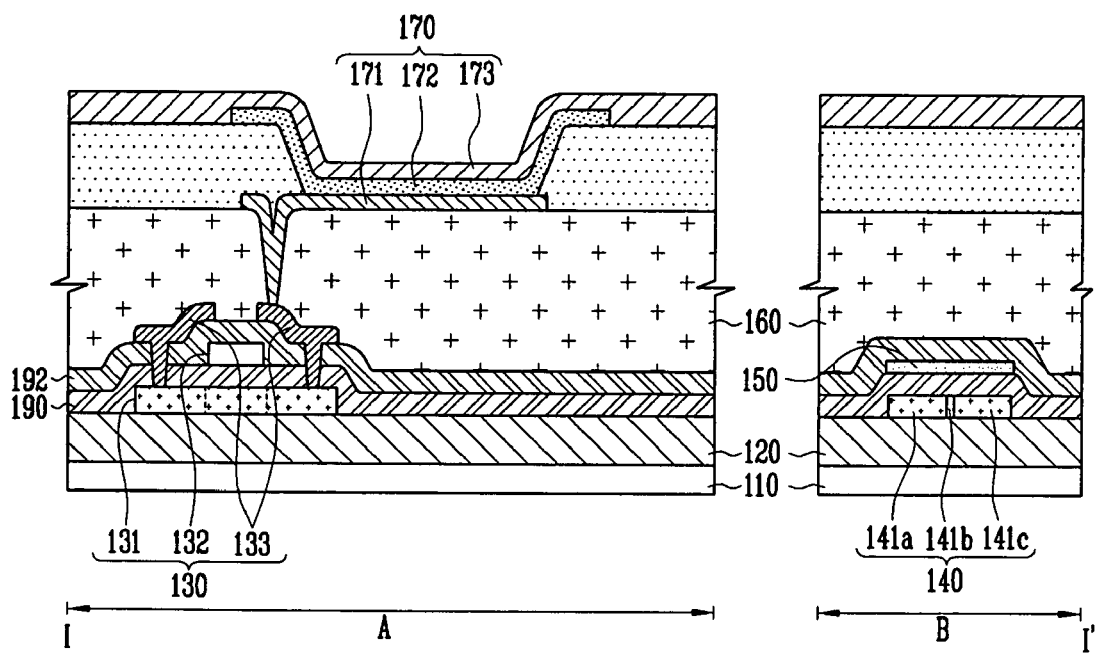
FIG. 5 illustrates a cross-sectional view along line I-I' of FIG. 4.
Figure 6:
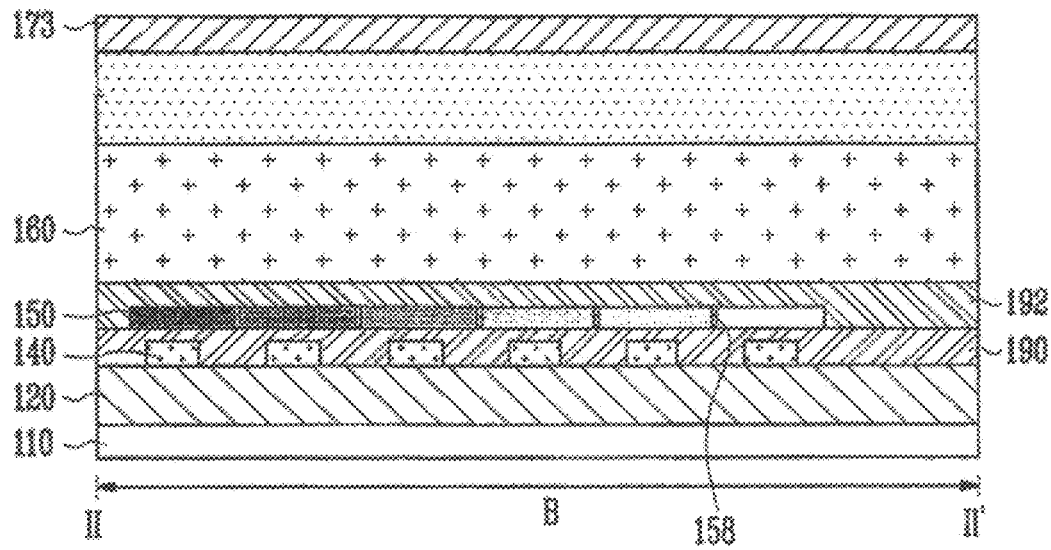
FIG. 6 illustrates a cross-sectional view along line II-II' of FIG. 4.
Figure 7:
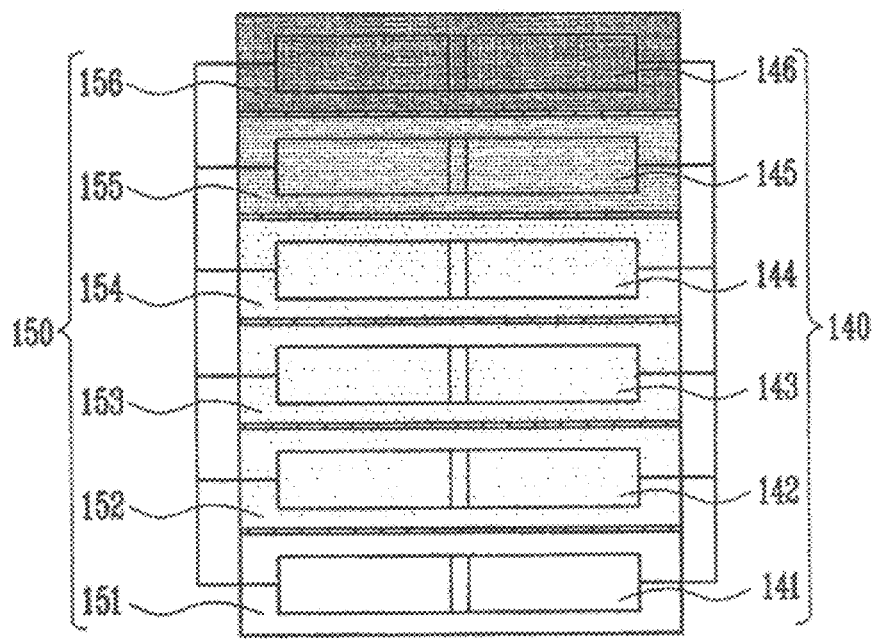
FIG. 7 illustrates a plan view of a photo sensor in the organic light emitting display of FIG. 4.

FIG. 4 illustrates a perspective view of an organic light emitting display according to an embodiment of the present invention. FIG. 5 illustrates a cross-sectional view along line I-I' of FIG. 4. FIG. 6 illustrates a cross-sectional view along line II-II' of FIG. 4. FIG. 7 illustrates a plan view of a photo sensor in the organic light emitting display of FIG. 4.

Referring to FIG. 4-6, an organic light emitting display 100 may include a pixel region A with at least one thin film transistor (TFT) 130 and at least one OLED 170 electrically connected to the TFT 130, and a non-pixel region B with a driving circuit unit 180 and a pad unit (not shown). The pixel region A may also include scan lines and data lines on a substrate 110, so a plurality of TFTs 130 may be coupled to each other via the scan lines and the data lines in a matrix structure to define pixels. The scan lines and data lines may extend from the pixel region A to the non-pixel region B, and may be connected to a power source voltage supply line for operating the at least one OLED 170 and to the driving circuit unit 180 for processing signals provided from the outside through the pad unit. The non-pixel region B may also include a photo sensor 195, as will be described in more detail below.

Hereinafter, the TFT 130 and the OLED 170 formed on the substrate 110 in the pixel region A will be described in detail. As illustrated in FIGS. 5-6, a buffer layer 120 may be formed on the substrate 110. The buffer layer 120 may be formed of a silicon oxide layer (SiO2) or a silicon nitride layer (SiNx), and may have a multiple layer structure. The buffer layer 120 may prevent diffusion of impurities into the TFT 130 and the photo sensor 195.

The TFT 130 may be formed on the buffer layer 120 in the pixel region A of the substrate 110. The TFT 130 may include a semiconductor layer 131, a gate electrode 132, and source and drain electrodes 133 formed sequentially on the buffer layer 120. The semiconductor layer 131 may be formed on the buffer layer 120 of, e.g., polysilicon. A gate insulating layer 190 may be formed on the semiconductor layer 131. The gate electrode 132 may be formed on the gate insulating layer 190 to have a predetermined pattern. An interlayer insulating layer 192 may be formed on the gate electrode 132 and on the gate insulating layer 190. The source and drain electrodes 133 may be formed on the interlayer insulating layer 192, and may be electrically connected through contact holes in the interlayer insulating layer 192 and the gate insulating layer 190 to the semiconductor layer 131.

A planarizing layer 160 including a via hole may be formed on the substrate 110 to coat the TFT 130. The OLED 170 may be coupled to the source and drain electrodes 133 of the TFT 130 through the via hole in the planarizing layer 160. The OLED 170 may include a first electrode 171 electrically connected to one of the source and drain electrodes 133, an emission layer 172 on the first electrode 171, and a second electrode 173 on the emission layer 172. The emission layer 172 may include a hole transport layer, an organic light emitting layer, and an electron transport layer laminated with each other. The emission layer 172 may further include a hole injection layer and/or an electron injection layer. When a predetermined voltage is applied to the OLED 170, i.e., to the first electrode 171 and the second electrode 173, holes injected through the first electrode 171 and electrons injected through the second electrode 173 may be re-coupled with each other in the emission layer 172 to emit visible light by a difference in energy generated in the process. Brightness of the visible light emitted by the OLED 170 may be controlled by the photo sensor 195 in accordance with external light, e.g., light in a peripheral environment surrounding the organic light emitting display 100.

The photo sensor 195 of the organic light emitting display 100 may be a photo sensor according to embodiments of the present invention. In particular, the photo sensor 195 may be any one of or a modification of the photo sensor 10, photo sensor 20, and photo sensor 30 described previously with reference to FIGS. 1-3. For example, the photo sensor 195 may include a light incidence unit 150 and a photo sensing unit 140, as illustrated in FIGS. 4-7. In particular, as illustrated in FIGS. 6-7, the light incidence unit 150 may include a plurality of light incidence layers and the photo sensing unit 140 may include a plurality of photo sensing elements. Each of the light incidence layers of the light incidence unit 150 may be above a respective photo sensing element of the photo sensing unit 140. The light incidence layers of the light incidence unit 150 may transmit varying amounts of light, so each of the photo sensing elements of the photo sensing unit 140 may detect different amounts, thereby being controlled with respect to their on/off state.

For example, the photo sensing unit 140 may include first through sixth photo sensing elements 141, 142, 143, 144, 145, and 146, as illustrated in FIG. 7, formed in the non-pixel region B of the substrate 110. Formation of the photo sensing unit 140 in the non-pixel region B may position the first to sixth photo sensing elements 141-146 away from a path of light emitted from the OLED 170 in order to minimize interference with light. In other words, the photo sensing elements of the photo sensing unit 140 may effectively operate with respect to external light, i.e., generate electrical signals with respect to the external light without interference with light emitted from the OLED 170. The photo sensing elements of the photo sensing unit 140 may be photo diodes connected in parallel to each other on the buffer layer 120 in the non-pixel region B. Accordingly, n photo diodes of W×L may be coupled to each other to have n parallel structures of W×L/n.

The photo sensing elements of the photo sensing unit 140 may be photo diodes having a PN structure and/or photo diodes having a PIN structure. For example, if the photo diodes are PIN diodes, each photo diode of the photo sensing unit 140 may includes an N type doping region 141a, an intrinsic region 141b, an a P type doping region 141c, as illustrated in FIG. 5. The PIN structured photo diode may be a semiconductor device that converts an optical signal into an electrical signal. For example, a method of driving a photo sending unit 140 including a plurality of PIN structured photo diodes is as follows. When light is incident on the photo diode while applying a negative (−) voltage to the P type doping region 141c and a positive (+) voltage to the N type doping region 141a, the electrons and holes may be generated by the intrinsic region 141b in accordance with an amount of light incident thereon to trigger current flow, i.e., due to optical energy and/or electrons/holes generated by the N and P type doping regions 141a and 141c to be diffused to the intrinsic region 141b. Therefore, current may flow through the photo diode due to the reverse direction electric field of the intrinsic region 141b.

The light incidence unit 150 may be provided on a light path through which external light enters the photo sensing unit 140, and may be formed on the photo sensing unit 140. A layer may be formed between the photo sensing unit 140 and the light incidence unit 150. In addition, portions of the layer may be interposed between adjacent photo sensing elements of the photo sensing unit 140. For example, as illustrated in FIG. 6, the gate insulating layer 190 may be interposed between the photo sensing unit 140 and the light incidence unit 150. The light incidence unit 150 may be attached to the gate insulating layer 190 using, e.g., adhesive. Examples of the adhesive may include one or more of a transparent adhesive, an adhesive frit, and/or an adhesive tape.

The light incidence unit 150 may include first through sixth light incidence layers 151, 152, 153, 154, 155, and 156 arranged to correspond to respective first to sixth photo sensing elements 141-46. Each of the first through sixth light incidence layers 151-156 may have a different optical transmittance, so that an amount of external light transmitted through each of the incidence layers toward respective photo sensing elements under the same condition may be different. In other words, when external light under the same condition is incident on the first to sixth light incidence layers 151-156, the amounts of light reaching the respective first to sixth photo sensing elements 141-46 may be different from each other according to the optical transmittances of each of the light incidence layers. The optical transmittance of the light incidence layers may vary gradually, e.g., from high transmittance to low transmittance.

For example, the first to sixth light incidence layers 151-156 may have light transmittance that uniformly and gradually varies from about 100% to about 1%. In other words, when external light having a constant luminance is incident on the light incident unit 150, about 100% of the incident light may be transmitted through the first light incidence layer 151 toward the first photo sensing element 141, about 80% of the incident light may be transmitted through the second light incidence layer 152 toward the second photo sensing element 142, about 60% of the incident light may be transmitted through the third light incidence layer 153 toward the third photo sensing element 143, about 40% of the incident light may be transmitted through the fourth light incidence layer 154 toward the fourth photo sensing element 144, about 20% of the incident light may be transmitted through the fifth light incidence layer toward the fifth photo sensing element 145, and about 1% of the incident light may be transmitted through the sixth light incidence layer 156 toward the sixth photo sensing element 146. Accordingly, since each of the first to sixth photo sensing elements 141 to 146 may detect different amounts of light, the sensitivity of the photo sensor 195 may be increased with respect to varying external luminance conditions. Therefore, accuracy of measurement of the external light may be increased.

For example, operation of the photo sensor 195 may be explained with respect to external light conditions defined by Table 2.

TABLE 2

| Embodiments | Luminance (lx) | Operating Conditions |
| --- | --- | --- |
| Range 1 | 0~80 | Darkness and very dark indoors |
| Range 2 | 80~300 | Dark indoors and passages |
| Range 3 | 300~1000 | Bright indoors |
| Range 4 | >1000 | Circumference of windows or outdoors |

When sufficient light, i.e., light of a specific amount, is radiated onto photo sensing elements of the photo sensing unit 140, current no less than a specific current, i.e., a threshold current, may flow through the photo sensing elements of the photo sensing unit 140, so the photo sensing elements may be turned on. Therefore, since each of the photo sensing elements of the photo sensing unit 140 detects light transmitted through a light incidence layer with a different transmittance, the number of turned-on photo sensing elements may depend on the amount of external light incident on the light incidence unit 150, i.e., operating conditions. For ease of description only first to sixth photo sensing elements 141-146 will be referred to hereinafter as photo diodes.

For example, if the external light is within Range 1, i.e., dark environment, all the amount of light may be transmitted through the first light incidence layer 151, i.e., a layer having about 100% transmittance value, toward the first photo diode 141. If the amount of light incident on the first photo diode 141 is sufficient to generate a current flow, i.e., no less than a threshold current, the first photo diode 141 may be turned on. Since the external light within Range 1 has low luminance, the amount of transmitted light incident on the second to sixth photo diodes 142 to 146 may be insufficient to generate a current flow above a threshold current. Accordingly, only the first photo diode 141 may be turned on and second to sixth photo diodes 142 to 146 may be turned off.

If the external light is within Range 2, i.e., dark indoors and passages, the amount of light transmitted through the first to third light incidence layers 151 to 153 may be sufficient to generate a current flow above a threshold current in the first to third photo diodes 141 to 143. Accordingly, the first to third photo diodes 141 to 143 may be turned on and the fourth to sixth photo diodes 144 to 146 may be turned off.

If the external light is within Range 3, i.e., bright indoors, the amount of light transmitted through the first to fifth light incidence layers 151 to 155 may be sufficient to generate a current flow above a threshold current in the first to fifth photo diodes 141 to 145. Accordingly, the first to fifth photo diodes 141 to 145 may be turned on and the sixth photo diode 146 may be turned off.

If the external light is within Range 4, i.e., circumference of windows or outdoors, the amount of light transmitted through the first to sixth light incidence layers 151 to 156 may be sufficient to generate a current flow above a threshold current in all the first to sixth photo diodes 141 to 146. Accordingly, the first to sixth photo diodes 141 to 146 may be turned on.

As seen from the above description, a number of turned-on photo diodes, i.e., first to sixth photo diodes 141 to 146, may increase sequentially as external luminance increases. Therefore, use of multiple light incidence layers with varying transmittance values, e.g., first to sixth light incidence layers 151 to 156, may improve light sensitivity of the photo diodes to external light, so intensity of the external light may be measured with improved precision and accuracy. In other words, the threshold current in each photo diode of the photo sensing unit 140 may be turned on/off with respect to light transmitted through the respective light incidence layer, so controlling transmittance of light through a plurality of light incidence layers with different transmittance values may facilitate improved precision and accuracy in measuring luminance of external light according to photo diodes being turned on. For example, turning on/off of the photo diodes may be controlled by adjusting the number of and transmittance through the light incidence unit 150. Accordingly, the photo sensor 195 of the organic light emitting display 100 may effectively measure luminance of external light by checking the turned on/off photo diodes, and may output electrical signals to the OLED 170 in order to adjust brightness thereof. Therefore, the OLED 170 may have increased lifespan and improved brightness control with respect to external light, so the organic light emitting display 100 may have reduced power consumption.

The light incidence unit 150 may be made of, e.g., a filter, celluloid, glass, or plastic, and each light incidence layer of the light incidence unit 150 may be formed to have a different transmittance with respect to the external light. The light incidence layers of the light incidence unit 150 may be formed continuously or discretely. For example, the light incidence unit 150 may be formed to have the light incidence layers in direct contact with each other, e.g., the light incidence unit 22 illustrated in FIG. 2. Alternatively, the light incidence unit 150 may include a plurality of partitions 158. Each partition 158 may be formed between two adjacent light incidence layers in order to separate, e.g., completely disconnect, the adjacent light incidence layers from each other. The partitions 158 may have a substantially same height, i.e., a distance along a vertical direction perpendicular to a surface supporting the photo sensor 195, as the light incidence unit 150. For example, the partitions 158 may extend from the photo sensing unit 140 toward an upper surface of the light incidence unit 150. The partitions 158 may be formed of a light shielding material and, therefore, may prevent spreading of transmitted external light between adjacent light incidence layers in order to improve accuracy of light detection of each photo sensing element of the photo sensing unit 140.

An organic light emitting display according to embodiments of the present invention may be advantageous in providing a photo sensor with enhanced light sensitivity. In particular, since a dynamic range on/off current ratio of a photo diode may be low, e.g., a high amount of light may increase current and cause saturation, use of the light incidence unit 150 in the photo sensor 195 may substantially increase sensitivity to light of the photo sensing unit 140. In other words, providing the light incidence unit 150 with varying light transmittance in a light path of the external light incident on the photo sensing unit 140 may improve efficiency of the photo sensing unit 140, i.e., the sensitivity of the photo sensing elements of the photo sensing unit 140 may be improved.

Figure 8:
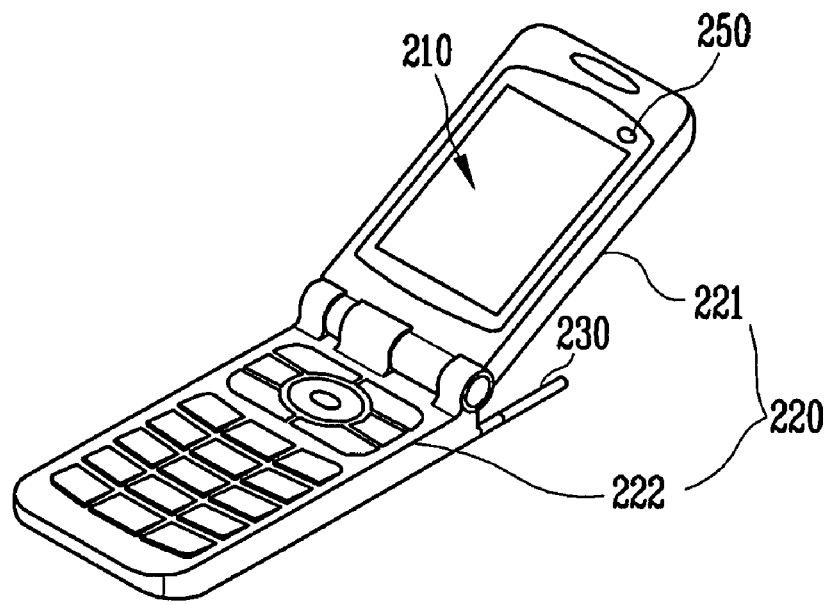
FIG. 8 illustrates a perspective view of an apparatus including the organic light emitting display of FIG. 4.

FIG. 8 illustrates a perspective view of an apparatus including an organic light emitting display with a photo sensor of FIG. 4. Referring to FIG. 8, a mobile telephone terminal may include an image display 210, a body unit 220 having a first body 221 and a second body 222, and a photo sensor unit 250. A power supply and a driving unit may be provided in the body unit 220. In addition, the body unit 220 may include an antenna 230, a radio frequency (RF) transceiver, and a baseband processor to perform RF communication.

The photo sensor unit 250 may be substantially similar to any of the photo sensor units described previously with reference to FIGS. 1-7, e.g., the photo sensor 10, the photo sensor 20, the photo sensor 30, or the photo sensor 195. A light incidence unit of the photo sensor 250 may be on any side of the body unit 220. For example, the light incidence unit may be positioned on a same side and in close proximity to the image display 210, e.g., on an inner surface of the first body 221, as illustrated in FIG. 8. Such a configuration may facilitate incidence of a substantially same amount of light on the photo sensor unit 250 and on the image display 210, so the photo sensor unit 250 may measure light in a close proximity to the image display 210. A photo sensing unit of the photo sensor 250 (not shown) may be below the light incidence unit, e.g., in a lower side of the photo sensor 250. Layers between the photo sensing unit and the light incidence unit may be transparent to facilitate transmittance of light incident on the light incidence unit of the photo sensor unit 250. Alternatively, the light incidence unit may be formed on an uppermost layer of an organic light emitting display, i.e., in contact with an ambient atmosphere surrounding the organic light emitting display. For example, the light incidence unit may be an uppermost layer of the organic light emitting display, so an upper surface of the light incident unit may be an upper surface of the photo sensor 250, i.e., circle adjacent to the image display 210 in FIG. 8.

Although the present invention has been described with respect to an organic light emitting display, a photo sensor according to embodiments of the present invention may be used in other displays, e.g., a liquid crystal display (LCD), a field effect emission display (FED), a plasma display panel (PDP), an electroluminescent display (ELD), and a vacuum fluorescent display (VFD).

According to embodiments of the present invention, a plurality of light incidence layers having different light transmittance values with respect to the external light may be formed in the light path through which the external light enters the photo sensing elements, so light sensitivity of the photo sensing elements may be improved. Therefore, accuracy and precision of measurement of external luminance using a photo sensor according to embodiments of the present invention may be improved, so brightness control of an OLED via the photo sensor with respect to the external light may be enhanced. As such, lifespan of the OLEDs may be improved and power consumption thereof may be reduced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A light emitting display device including a light emission layer, a photo sensor, and an electrode connected to the light emission layer, the electrode overlapping the light emission layer and the photo sensor, the photo sensor comprising:
   a light incidence unit including a plurality of light incidence layers, the light incidence unit having a varying light transmittance with respect to external light, and the light incidence layers being under the electrode; and
   a photo sensing unit including a plurality of PIN-structured photo diodes, the photo sensing unit being configured to output electrical signals in accordance with an amount of light transmitted through the light incidence unit to determine intensity of the external light, each of the photo sensing elements being configured to output electrical signals in accordance with light transmitted through a respective light incidence layer.

2. The photo sensor as claimed in claim 1, wherein the light incidence unit is on the photo sensing unit.

3. The photo sensor as claimed in claim 2, wherein the light incidence layers are coplanar, each light incidence layer overlapping a respective photo sensing element.

4. The photo sensor as claimed in claim 3, wherein a surface area of a surface of each light incidence layer facing the photo sensing element substantially equals a surface area of a surface of the respective photo sensing element facing the light incidence layer.

5. The photo sensor as claimed in claim 3, wherein a surface area of a surface of each light incidence layer facing the photo sensing element is larger than a surface area of a surface of the respective photo sensing element facing the light incidence layer.

6. The photo sensor as claimed in claim 1, wherein the photo sensing elements are spaced apart from each other.

7. The photo sensor as claimed in claim 1, wherein the light incidence unit is in a light path of the external light incident on the photo sensing unit.

8. The photo sensor as claimed in claim 1, wherein each of the light incidence layers exhibits a uniform light transmittance, the light transmittance of each light incidence layer being different than the light transmittance of other light incidence layers in the light incidence unit.

9. The photo sensor as claimed in claim 8, wherein the light incidence layers are arranged to have a gradually varying light transmittance from a high light transmittance to a low light transmittance.

10. The photo sensor as claimed in claim 1, wherein the light incidence layers include one or more of glass, celluloid, and/or plastic.

11. The photo sensor as claimed in claim 1, wherein the light incidence unit includes a plurality of partitions, each partition being between two adjacent light incidence layers.

12. The photo sensor as claimed in claim 1, wherein the photo sensing elements include photo diodes, photo resistors, and/or photo transistors.

13. The photo sensor as claimed in claim 1, wherein the photo sensing elements have a substantially same threshold current.

14. A light emitting display, comprising:
a light source including a light emission layer and an electrode connected to the light emission layer, the electrode overlapping the light emission layer; and
a photo sensor electrically connected to the light source, the electrode overlapping the photo sensor, the photo sensor including:
a light incidence unit including a plurality of light incidence layers, the light incidence unit having a varying light transmittance with respect to external light, and the light incidence layers being under the electrode; and
a photo sensing unit including a plurality of PIN-structured photo diodes, the photo sensing unit being configured to output electrical signals in accordance with an amount of light transmitted through the light incidence unit to determine intensity of the external light, each of the photo sensing elements being configured to output electrical signals in accordance with light transmitted through a respective light incidence layer.

15. The light emitting display as claimed in claim 14, further comprising a thin film transistor on a substrate, the thin film transistor including a semiconductor layer, a gate insulation layer, a gate electrode, an interlayer insulating layer, and source and drain electrodes.

16. The light emitting display as claimed in claim 15, wherein the light source is an organic light emitting diode, the organic light emitting diode being electrically coupled with the thin film transistor.

17. The light emitting display as claimed in claim 16, wherein the electric signals output from the photo sensor are configured to adjust brightness of the organic light emitting diode with respect to the external light.

18. The light emitting display as claimed in claim 15, wherein the photo sensor is in a non-pixel region of the substrate.

19. The light emitting display as claimed in claim 14, further comprising at least one insulating layer between the light incidence unit and the photo sensing unit.

20. The light emitting display as claimed in claim 15, wherein the interlayer insulating layer overlaps the light incidence unit and the gate electrode.

21. The light emitting display as claimed in claim 14, wherein bottom surfaces of the photo sensing unit and the thin film transistor are substantially coplanar.

* * * * *